United States Patent
Kim et al.

(10) Patent No.: US 12,398,459 B2
(45) Date of Patent: Aug. 26, 2025

(54) SILICON METAL OXIDE ENCAPSULATION FILM COMPRISING METAL OR METAL OXIDE IN THIN FILM, AND MANUFACTURING METHOD THEREFOR

(71) Applicant: DNF CO., LTD., Daejeon (KR)

(72) Inventors: Myoung Woon Kim, Daejeon (KR); Sang Ick Lee, Daejeon (KR); Se Jin Jang, Jeju-do (KR); Sung Gi Kim, Daejeon (KR); Jeong Joo Park, Sejong si (KR); Won Mook Chae, Daejeon (KR); A Ra Cho, Daejeon (KR); Byeong il Yang, Daejeon (KR); Joong Jin Park, Daejeon (KR); Gun Joo Park, Daejeon (KR); Sam Dong Lee, Daejeon (KR); Haeng don Lim, Daejeon (KR); Sang Yong Jeon, Sejong si (KR)

(73) Assignee: DNF CO., LTD, Daejeon (KR)

( * ) Notice: Subject to any disclaimer, the term of this patent is extended or adjusted under 35 U.S.C. 154(b) by 754 days.

(21) Appl. No.: 17/435,350

(22) PCT Filed: Mar. 6, 2020

(86) PCT No.: PCT/KR2020/003156
§ 371 (c)(1),
(2) Date: Aug. 31, 2021

(87) PCT Pub. No.: WO2020/184910
PCT Pub. Date: Sep. 17, 2020

(65) Prior Publication Data
US 2022/0181578 A1    Jun. 9, 2022

(30) Foreign Application Priority Data

Mar. 8, 2019 (KR) .................. 10-2019-0026707
Mar. 5, 2020 (KR) .................. 10-2020-0027865

(51) Int. Cl.
*C23C 16/40* (2006.01)
*C23C 16/455* (2006.01)
(Continued)

(52) U.S. Cl.
CPC ...... *C23C 16/401* (2013.01); *C23C 16/45531* (2013.01); *C23C 16/45542* (2013.01); *H10K 59/873* (2023.02); *H10K 2102/311* (2023.02)

(58) Field of Classification Search
CPC ............ C23C 16/401; C23C 16/45531; C23C 16/45542; H10K 59/873; H10K 2102/311
See application file for complete search history.

(56) References Cited

U.S. PATENT DOCUMENTS

| 9,263,359 B2 * | 2/2016 | Dickey | ............ C23C 16/45531 |
| 2005/0064207 A1 * | 3/2005 | Senzaki | ............ C23C 16/45531 257/E21.267 |

(Continued)

FOREIGN PATENT DOCUMENTS

| JP | 2012504304 A | 2/2012 |
| JP | 2016515166 A | 5/2016 |

(Continued)

OTHER PUBLICATIONS

TW Office Action and Search Report for Patent Application No. 109107484, dated Jul. 19, 2022, 7 pp.
(Continued)

*Primary Examiner* — Gerard Higgins
(74) *Attorney, Agent, or Firm* — NIXON PEABODY LLP

(57) ABSTRACT

The present invention relates to a silicon oxide encapsulation film comprising a metal or a metal oxide, and a manufacturing method therefor. The silicon metal oxide encapsulation film according to the present invention has a high thin film growth rate and low moisture and oxygen permeabilities, thereby exhibiting a very excellent sealing
(Continued)

effect even at a low thickness, and the stress strength and refractive index thereof can be controlled, thereby enabling a high-quality silicon metal oxide encapsulation film that is applicable to a flexible display to be readily manufactured.

15 Claims, 3 Drawing Sheets

(51) Int. Cl.
*H10K 59/80* (2023.01)
*H10K 102/00* (2023.01)

(56) References Cited

U.S. PATENT DOCUMENTS

| | | |
|---|---|---|
| 2007/0207696 A1 | 9/2007 | Park et al. |
| 2014/0242736 A1 | 8/2014 | Dickey et al. |
| 2014/0322527 A1 | 10/2014 | Cho et al. |
| 2017/0137941 A1 | 5/2017 | Koyama et al. |

FOREIGN PATENT DOCUMENTS

| | | |
|---|---|---|
| JP | 2017147046 A | 8/2017 |
| JP | 2017191838 A | 10/2017 |
| KR | 20140130016 A | 11/2014 |
| KR | 20150125941 A | 11/2015 |
| KR | 20170047417 A | 5/2017 |
| KR | 20180003287 A | 1/2018 |
| TW | I588874 B | 6/2017 |
| WO | 2017200254 A1 | 11/2017 |

OTHER PUBLICATIONS

JP Office Action for Patent Application No. 2021-553164, dated Oct. 17, 2022, 8 pp.

* cited by examiner

[FIG. 1]
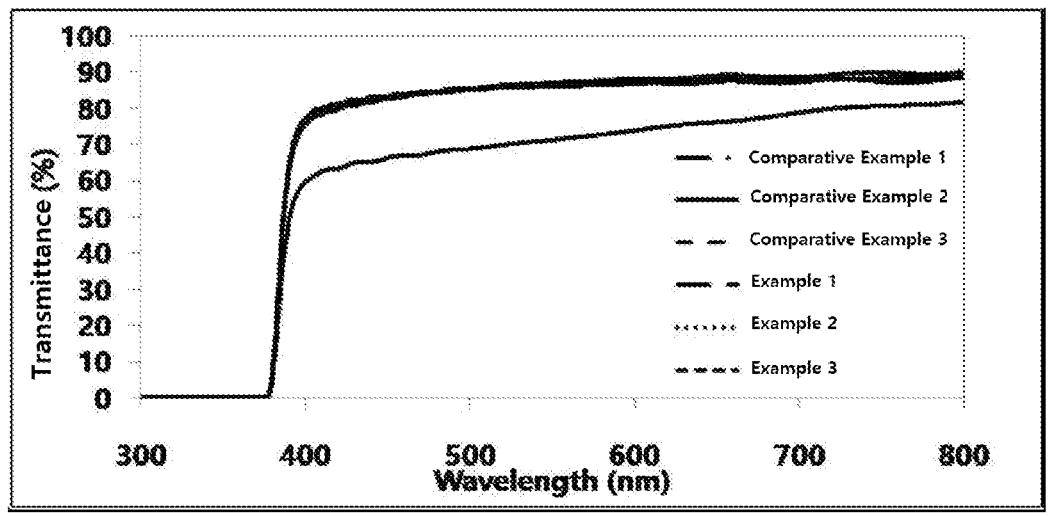
[FIG. 2]
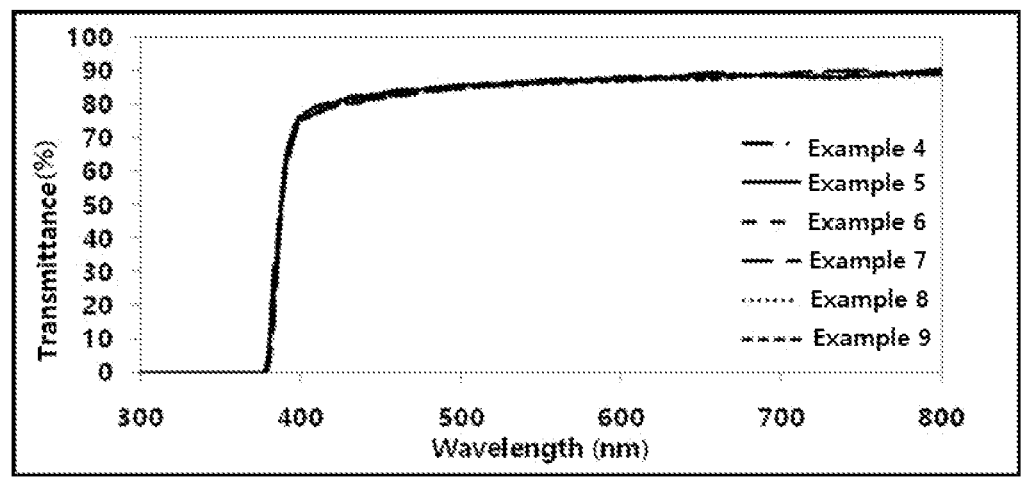
[FIG. 3]
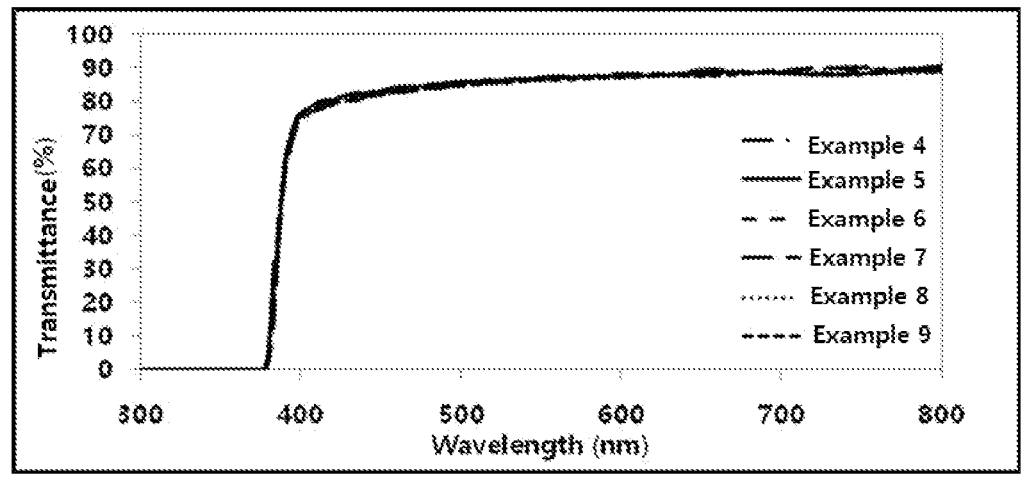

[FIG. 4]
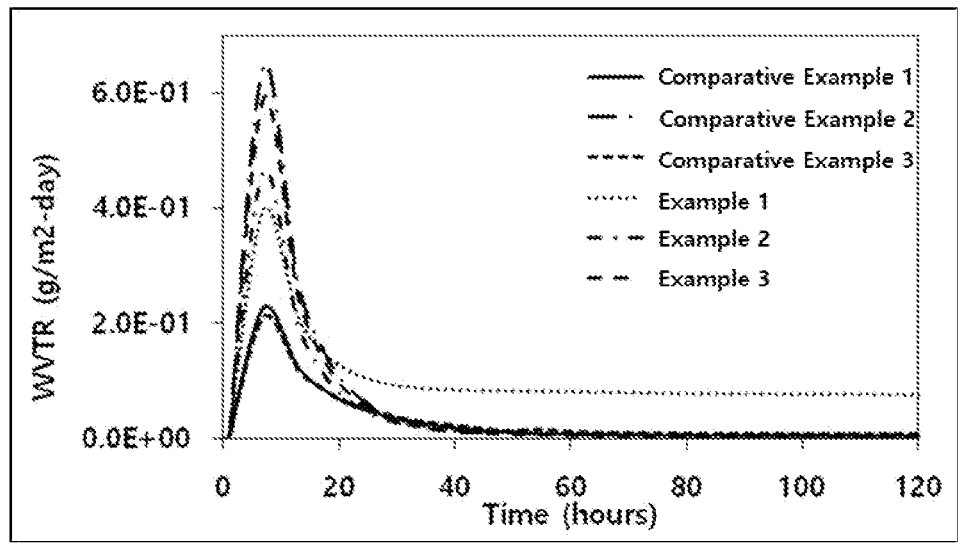
[FIG. 5]
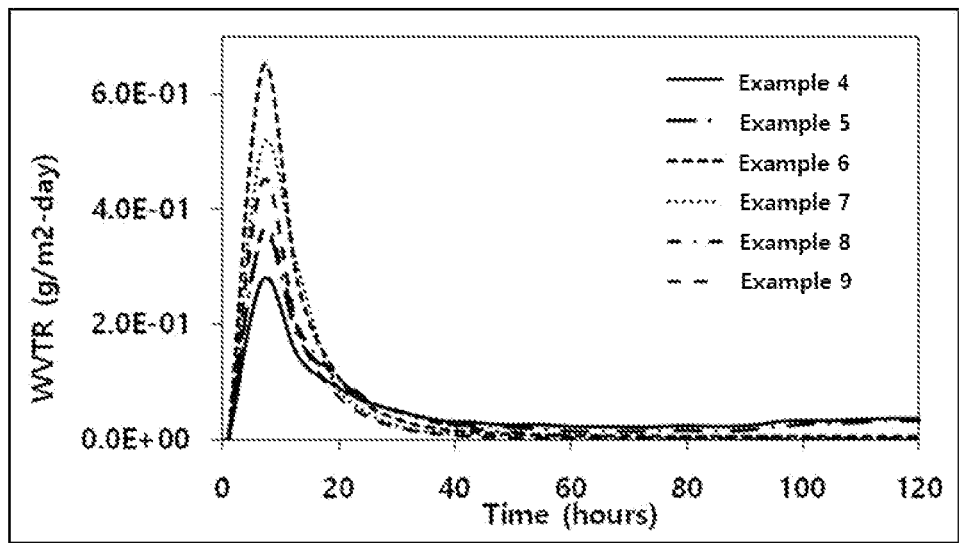

[FIG. 6]
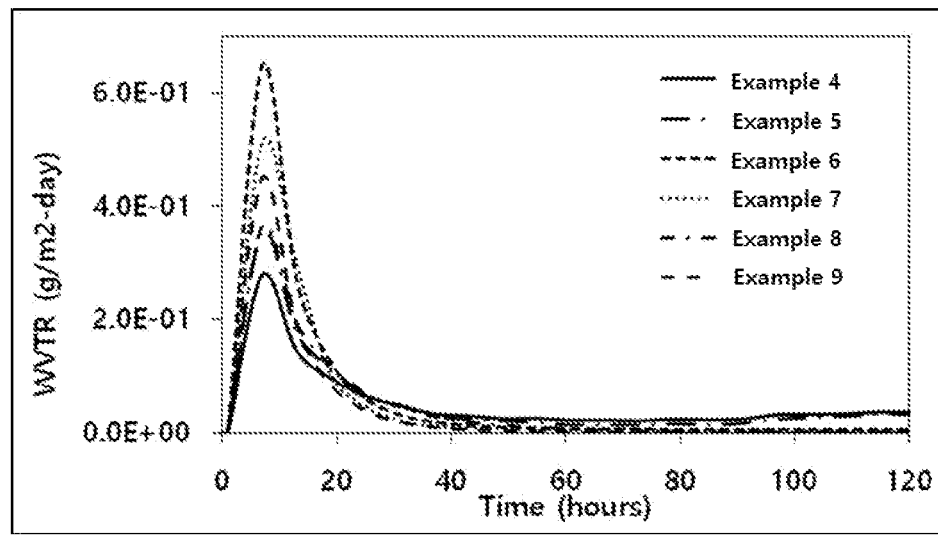
[FIG. 7]
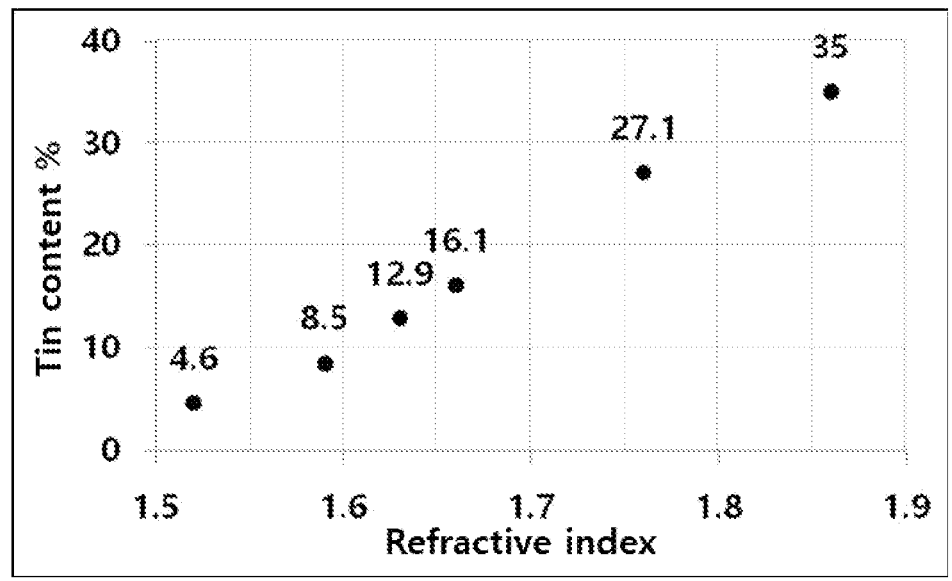

SILICON METAL OXIDE ENCAPSULATION FILM COMPRISING METAL OR METAL OXIDE IN THIN FILM, AND MANUFACTURING METHOD THEREFOR

CROSS-REFERENCE TO RELATED APPLICATIONS

This application is the United States National Phase of International Application No.: PCT/KR2020/0003156, filed Mar. 6, 2020, which in turn claims priority benefit of The Republic of Korea Application No.: KR 10-2019-0026707, filed Mar. 8, 2019, and Republic of Korea Application No.: KR 10-2019-0027865, filed Mar. 5, 2020, the entire contents of which are herein incorporated by reference in their entirety.

TECHNICAL FIELD

The present invention relates to a silicon oxide encapsulation layer including a metal or a metal oxide in a thin film and a method of producing the same, and more particularly, to a silicon metal oxide encapsulation layer formed by using a silicon precursor and a metal precursor and a method of producing the same.

BACKGROUND ART

In general, an organic semiconductor device is vulnerable to moisture or oxygen and is easily oxidized by moisture or oxygen in the air so that the electrical properties thereof are deteriorated. Accordingly, the core of an encapsulation process of a device is blocking from moisture and oxygen, which may be an important technology to determine a panel life. The encapsulation technology may be largely classified into three methods which are a method of using a glass/metal container (Can, glass encapsulation), thin film encapsulation (TFE), and hybrid encapsulation using both a thin film and a glass container, and each method may be described in a way of using a cover made of a metal or glass material having gas barrier properties and a container having a moisture absorbent (getter), a thin film encapsulation way which may be referred to as a face sealing method implementing barrier properties by an organic and inorganic or inorganic multilayer thin film on an upper layer of a device, and a hybrid way in which a plastic barrier film is used as a cover and an adhesive layer is disposed between passivation thin films.

The method of using a glass/metal container (Can, glass encap) which has been widely used to date shows the best encapsulation properties with a technique of sealing by melting glass powder by laser, with an organic semiconductor device disposed between two pieces of glasses composed of a substrate and a cover, or technique of sealing by using a UV adhesive, but thermal conduction properties are poor due to an inert gas in the device and costs are increased by glass processing due to a larger area, and also there are many problems in applying the method to a flexible panel requiring flexibility.

In order to supplement the demerits of the glass encapsulation technology (Can, glass encapsulation), thin film encapsulation (TFE) in which an inorganic layer such as Al2O3 having high barrier properties to oxygen or moisture and an organic layer of a polymer as a thin film are alternately laminated on an entire surface of the organic semiconductor device to form a multilayer encapsulation layer, has been actively studied.

In the recent study, encapsulation technology of a thin film having high film density and excellent transmittance properties has been developed, but most of the components of the organic layer of the multilayer encapsulation layer are UV-curable materials, and since the organic encapsulation layer using UV curing uses a solution process, electrical properties and flexibility are deteriorated due to property deterioration by a solvent and life is decreased. In addition, the encapsulation layer composed of an inorganic layer causes the thickness to be increased to secure good properties, but flexibility is poor.

In order to supplement the problems, there is needed a study on a method of producing an encapsulation layer having excellent sealing properties to prevent moisture or oxygen in the air from being penetrated and high flexibility, even in the case of having a small thickness.

DISCLOSURE

Technical Problem

An object of the present invention is to provide a silicon metal oxide encapsulation layer doped with a metal and a metal oxide.

Another object of the present invention is to provide a method of producing a silicon metal oxide encapsulation layer of the present invention.

Technical Solution

In one general aspect, a silicon metal oxide encapsulation layer is represented by the following Chemical Formula 1:

$$Si_xM_yO_z \qquad \text{[Chemical Formula 1]}$$

wherein
M is a metal,
x satisfies $0.1<x<1$,
y satisfies $0<y<2$,
z satisfies $1 \leq z \leq 3$,
x+y satisfies $1<x+y<3$, and
x+y+z satisfies $1.5<x+y+z<6$.

The encapsulation layer according to an exemplary embodiment of the present invention may be an encapsulation layer for a display OLED.

In the encapsulation layer according to an exemplary embodiment of the present invention, M in Chemical Formula may be one or more metals selected from the group consisting of Groups 1B to 5B and Groups 3A to 4A in the periodic table.

The silicon metal oxide encapsulation layer according to an exemplary embodiment of the present invention may include a metal atom at a content within 1 to 50 at % relative to a total content of the silicon metal oxide.

In the silicon metal oxide encapsulation layer according to an exemplary embodiment of the present invention, a vapor transmission rate may be $1.0 \times 10^{-2}$ to $1.0 \times 10^{-6}$ g/m²-day.

In the silicon metal oxide encapsulation layer according to an exemplary embodiment of the present invention, a stress may be −700 to +700 MPa.

In the silicon metal oxide encapsulation layer according to an exemplary embodiment of the present invention, a refractive index may be in a range of 1.0 to 10.

The silicon metal oxide encapsulation layer according to an exemplary embodiment of the present invention may be dry-etched by one or more etching gases selected from fluorine-containing compounds, $NF_3$, and $BCl_3$.

In the silicon metal oxide encapsulation layer according to an exemplary embodiment of the present invention, a thickness of a thin film may be 50 to 700 Å.

In another general aspect, a method of producing a silicon metal oxide encapsulation layer represented by the following Chemical Formula 1 uses an atomic layer deposition (ALD).

$$Si_xM_yO_z \quad \text{[Chemical Formula 1]}$$

wherein
M is a metal,
x satisfies 0.1<x<1,
y satisfies 0<y<2,
z satisfies 1≤z≤3,
x+y satisfies 1<x+y<3, and
x+y+z satisfies 1.5<x+y+z<6.

In the method of producing a silicon metal oxide encapsulation layer according to an exemplary embodiment of the present invention, a metal precursor and a silicon precursor may be introduced into a reactor at the same time for production.

In the method of producing a silicon metal oxide encapsulation layer according to an exemplary embodiment of the present invention, the silicon precursor may be an organoaminosilane compound including a Si—N bond.

In the method of producing a silicon metal oxide encapsulation layer according to an exemplary embodiment of the present invention, the metal precursor may be an organometal compound containing one or more metal elements selected from Groups 1B to 5B and Groups 3A to 4A in the periodic table as a central metal.

The method of producing a silicon metal oxide encapsulation layer according to an exemplary embodiment may include:
introducing a metal precursor or a silicon precursor into a reactor at the same time so that the precursors are in contact with a substrate; and
bringing a reaction gas into contact with the substrate to produce a silicon metal oxide encapsulation layer on the substrate.

In the method of producing a silicon metal oxide encapsulation layer according to an exemplary embodiment of the present invention, the atomic layer deposition (ALD) may be a plasma enhanced atomic layer deposition (PEALD).

The reaction gas according to an exemplary embodiment of the present invention may be one or two or more selected from $O_2$, $N_2O$, $NO_2$, $H_2O$, $H_2O_2$, and $O_3$.

In another general aspect, a multilayer thin film for an OLED includes: a substrate, a first layer including a first silicon metal oxide represented by the following Chemical Formula 1, a second layer including a crosslinkable polymer, disposed on the first layer, and a third layer including a second silicon metal oxide represented by the following Chemical Formula 1, disposed on the second layer:

$$Si_xM_yO_z \quad \text{[Chemical Formula 1]}$$

wherein
M is a metal,
x satisfies 0.1<x<1,
y satisfies 0<y<2,
z satisfies 1≤z≤3,
x+y satisfies 1<x+y<3, and
x+y+z satisfies 1.5<x+y+z<6.

The multilayer thin film for an OLED according to an exemplary embodiment of the present invention may be a flexible transparent substrate.

The multilayer thin film for an OLED according to an exemplary embodiment of the present invention may have a radius of curvature of 2R or less.

In still another general aspect, an OLED device includes the encapsulation layer described above.

Advantageous Effects

Since the thin film of the silicon metal oxide encapsulation layer of the present invention has a very high density, the silicon metal oxide encapsulation layer has very excellent sealing properties to block moisture and oxygen penetrated from the outside, even in the case of having a small thickness.

In addition, since it is easy to adjust the refractive index of the silicon metal oxide encapsulation layer of the present invention, optical properties may be adjusted, and since it is easy to adjust stress, the silicon metal oxide encapsulation layer may be applied to a substrate for a flexible display.

In addition, the method of producing a silicon metal oxide encapsulation layer according to the present invention has a high thin film growth rate, and when the encapsulation layer including a metal or a metal oxide is deposited, particle removal and dry cleaning are easy through dry etching rate adjustment, so that the process time is shortened to increase productivity.

DESCRIPTION OF DRAWINGS

FIG. 1 is a graph representing transmittance of the silicon oxide encapsulation layers or metal oxide encapsulation layers of Comparative Examples 1 to 3 and the silicon metal oxide encapsulation layers produced in Examples 1 to 3.

FIG. 2 is a graph representing transmittance of the silicon metal oxide encapsulation layers produced in Examples 4 to 9.

FIG. 3 is a graph representing transmittance of the silicon metal oxide encapsulation layers produced in Examples 10 to 12.

FIG. 4 is a graph representing water vapor transmission rates of the silicon oxide encapsulation layers or metal oxide encapsulation layers of Comparative Examples 1 to 3 and the silicon metal oxide encapsulation layers produced in Examples 1 to 3.

FIG. 5 is a graph representing water vapor transmission rates of the silicon metal oxide encapsulation layers produced in Examples 4 to 9.

FIG. 6 is a graph representing water vapor transmission rates of the silicon metal oxide encapsulation layers produced in Examples 10 to 12.

FIG. 7 is a graph representing metal contents relative to refractive indexes of the silicon metal oxide encapsulation layers produced in Examples 7 to 12 of the present invention.

BEST MODE

Hereinafter, the silicon metal oxide encapsulation layer of the present invention which is doped with a metal or a metal oxide to include the metal or the metal oxide will be described in detail. Technical terms and scientific terms used herein have the general meaning understood by those skilled in the art to which the present invention pertains unless otherwise defined, and a description for the known function and configuration which may unnecessarily obscure the gist of the present invention will be omitted in the following description and the accompanying drawings.

The present invention provides a silicon metal oxide encapsulation layer represented by the following Chemical Formula 1:

$$Si_xM_yO_z \quad \text{[Chemical Formula 1]}$$

wherein
M is a metal,
x satisfies $0.1<x<1$,
y satisfies $0<y<2$,
z satisfies $1\leq z\leq 3$,
x+y satisfies $1<x+y<3$, and
x+y+z satisfies $1.5<x+y+z<6$.

The silicon metal oxide encapsulation layer represented by Chemical Formula 1 is a silicon oxide encapsulation layer including a metal or a metal oxide, and may be preferably a silicon oxide encapsulation layer doped with a metal or a metal oxide.

Preferably, in Chemical Formula 1, M may be a metal, x may satisfy $0.3<x<1$, y may satisfy $0.05<y<2$, z may satisfy $1.6\leq z\leq 2.7$, x+y may satisfy $1<x+y<2$, and x+y+z may satisfy $2.5<x+y+z\leq5.0$. The silicon metal oxide encapsulation layer of the present invention includes a metal or a metal oxide, thereby having an excellent vapor transmission rate and also excellent transmittance, refractive index, and flexibility to have improved physical properties in comparison with a conventional silicon oxide encapsulation layer.

In Chemical Formula 1 of the silicon metal oxide according to an exemplary embodiment of the present invention, M may be one or more metal elements selected from the group consisting of Groups 1B to 5B and Groups 3A to 4A in the periodic table, preferably one or two or more metals selected from Ti, Zr, Hf, Al, Ga, In, Sn, Pb, V, Cu, Ag, Nb, Zn, and Cd, and more preferably one or two or more metals selected from Zr, Hf, Al, Sn, and Zn.

According to a preferred embodiment of the silicon metal oxide encapsulation layer according to the present invention, the silicon metal oxide encapsulation layer in which a silicon oxide is doped with a metal element may include the metal atom at a content of preferably 1 to 50 at %, more preferably 1 to 40 at %, and more preferably 3 to 40 at %, relative to a total content of the silicon metal oxide, in terms of having better effects. When the content range of the metal doped on the silicon oxide as described above is satisfied, an excellent water vapor transmission rate (WVTR) may be achieved in spite of a small thickness of the silicon metal oxide encapsulation layer, and amorphousness of the silicon oxide is maintained, so that a grain boundary is not formed when the encapsulation layer is applied to a substrate. In addition, as the encapsulation layer has a small thickness and does not substantially include a grain boundary, the encapsulation layer formed on a flexible substrate may not be damaged and have excellent durability even in the case in which the flexible substrate is repeatedly folded.

The silicon metal oxide encapsulation layer according to a preferred embodiment of the present invention may be dry-etched using one or more etching gases selected from fluorine-containing compounds, $NF_3$, and $BCl_3$.

The gas used in etching of the silicon metal oxide encapsulation layer according to the preferred embodiment of the present invention may be a $C_xF_y$-based (x=an integer of 1 to 5 and y=an integer of 4 to 12) gas which is a gas containing carbon and fluorine, a $C_xH_yF_z$-based (x=an integer of 1 to 5, y=an integer of 1 to 4, z=an integer of 2 to 10, and y+z=2x+2) hydrofluorocarbon (HFC) gas, a hydrofluoroether (HFE) gas, an iodine fluorinated carbon (IFC) gas, a $NF_3$ gas, and a $BCl_3$ gas alone or a mixed gas thereof in combination. Preferably, the gas used in etching may be a gas selected from fluorine-containing compounds, in particular perfluoro compounds (perfluorocycloalkane), $NF_3$, and $BCl_3$ alone, or a mixed gas thereof. When the etching gas is used, a dry etching rate in the silicon metal oxide encapsulation layer may be adjusted to allow dry cleaning and also very easy particle removal.

The silicon metal oxide according to an exemplary embodiment of the present invention allows optical properties such as a viewing angle, diffuse reflection prevention, and a color expression rate to be adjusted by metal content change depending on a metal precursor, and a refractive index may be adjusted to a range of 1.0 to 10. The refractive index may be in a range of 1.0 to 5.0, more preferably 1.0 to 2.0, and still more preferably 1.4 to 1.9.

The silicon metal oxide encapsulation layer according to an exemplary embodiment of the present invention may have a thickness of 50 to 700 Å, preferably 50 to 400 Å, and a vapor transmission rate of $1.0\times10^{-2}$ to $1.0\times10^{-6}$ g/m²-day, preferably $1.0\times10^{-2}$ to $1.0\times10^{-5}$ g/m²-day.

The silicon metal oxide encapsulation layer according to an exemplary embodiment of the present invention may have a stress intensity of −700 to +700 MPa, preferably −500 to +500 MPa, and more preferably −200 to +200 MPa so that a compressive or tensile form is included. Through the stress adjustment to the above range, flexibility may be secured to prevent destruction caused by folding or bending by a flexible substrate in a flexible display.

According to the preferred embodiment of the present invention, the silicon metal oxide encapsulation layer may be applied to a flexible display device, and may be preferably an encapsulation layer for a display OLED.

According to the preferred embodiment of the present invention, when the silicon metal oxide encapsulation layer is included, it is easy to adjust the stress intensity and the refractive index by a content range of a metal, and thus, a conventional organic or inorganic multilayer thin film which is formed to be very thick since an organic material and an inorganic material are repeatedly stacked, may be replaced. That is, one silicon metal oxide layer according to the present invention may replace the multilayer thin film, so that a thin film encapsulation process may be significantly shortened and the layer may be very thin and secure optical properties and flexibility, and thus, the silicon metal oxide encapsulation layer may have high applicability as an encapsulation technology which is very appropriate for a flexible display such as a flexible OLED.

The present invention provides a method of producing a silicon metal oxide encapsulation layer represented by the following Chemical Formula 1, using an atomic layer deposition (ALD). As a preferred and specific example, the atomic layer deposition (ALD) may be a plasma enhanced atomic layer deposition (PEALD), in terms that thin film deposition is easier and the produced encapsulation layer has excellent properties.

$$Si_xM_yO_z \quad \text{[Chemical Formula 1]}$$

wherein
M is a metal,
x satisfies $0.1<x<1$,
y satisfies $0<y<2$,
z satisfies $1\leq z\leq 3$,
x+y satisfies $1<x+y<3$, and
x+y+z satisfies $1.5<x+y+z<6$.

In the production method according to an exemplary embodiment of the present invention, the silicon metal oxide encapsulation layer represented by Chemical Formula 1 may be produced by introducing a metal precursor and a silicon precursor into a reactor at the same time.

The silicon precursor is an organoaminosilane compound including a Si—N bond, and preferably (C1-C10)alkylaminosilane, more preferably (C1-C6)alkylaminosilane, and more preferably (C1-C3)alkylaminosilane. The alkyl of the present invention may be both linear and branched. In addition, the alkylaminosilane of the present invention includes all of trialkylaminosilane, dialkylaminosilane, or monoalkylaminosilane, and may be preferably di(C1-C6)alkylaminosilane, and more preferably di(C1-C3)alkylaminosilane. In addition, the metal precursor is an organometal compound containing one or more metals selected from Groups 1B to 5B and Groups 3A to 4A in the periodic table, and is preferably an organometal precursor containing one or more metal elements preferably selected from Ti, Zr, Hf, Al, Ga, In, Sn, Pb, V, Cu, Ag, Nb, Zn, and Cd, and more preferably selected from Zr, Hf, Al, Sn, and Zn, as a central metal.

The organometal precursor according to an exemplary embodiment of the present invention may be represented by the following Chemical Formula 2:

[Chemical Formula 2]

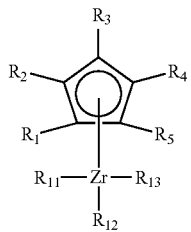

wherein $R_1$ to $R_5$ are independently of one another hydrogen or (C1-C7)alkyl; and $R_{11}$ to $R_{13}$ are independently of one another cyclopentadienyl, carbonyl, (C1-C4)alkyl, (C3-C5)allyl, or (C2-C4)alkenyl.

In the production method of a silicon metal oxide encapsulation layer according to an exemplary embodiment of the present invention, a reaction gas which is an oxygen-containing gas, a nitrogen-containing gas, a carbon-containing gas, or a mixed gas thereof may be supplied to a chamber having an object to be deposited positioned inside, before, during, or after supplying the metal precursor and the silicon precursor to the chamber. The reaction gas is any gas as long as it is commonly used with the metal precursor and the silicon precursor considering the material of the silicon metal oxide encapsulation layer to be produced, and as a specific example thereof, the oxygen-containing gas may be oxygen ($O_2$), ozone ($O_3$), distilled water ($H_2O$), hydrogen peroxide ($H_2O_2$), or the like, the nitrogen-containing gas may be nitrogen monoxide (NO), nitrous oxide ($N_2O$), nitrogen dioxide ($NO_2$), ammonia ($NH_3$), nitrogen ($N_2$), hydrazine ($N_2H_4$), or hydrazine derivatives such as tertiary butyl hydrazine ($C_4H_{12}N_2$), and the carbon-containing gas may be carbon monoxide (CO), carbon dioxide ($CO_2$), C1 to C12 saturated or unsaturated hydrocarbons, or the like, but these are one example, and the present invention is not limited thereto. In addition, the reaction gas may be used in combination with an inert gas such as nitrogen, helium, or argon, and as other reaction gas, hydrogen may be used.

In the production method of the silicon metal oxide encapsulation layer according to an exemplary embodiment of the present invention, the plasma enhanced atomic layer deposition (ALD) includes four steps of precursor introduction, precursor purging, plasma and reaction gas introduction, and reaction gas purging as one cycle. A deposition time may be 0.5 or more and less than 5.0 seconds in one cycle, and a temperature of the object to be deposited may be 20° C. or more and less than 150° C.

In the production method of the silicon metal oxide encapsulation layer according to an exemplary embodiment of the present invention, the metal precursor and the silicon precursor are supplied at the same time, and the reaction gas may be supplied with the supply of the precursors or supplied independently of the supply of the precursors to the chamber. In addition, the reaction gas may be continuously or discontinuously supplied to the chamber, respectively, and discontinuous supply may include a pulse form. In addition, the reaction gas may be in a state of being activated with plasma. Here, as described above, the reaction gas being activated with plasma may be an oxygen-containing gas, a nitrogen-containing gas, or a mixed gas thereof activated with plasma, and specifically any one or a mixed gas of two or more selected from oxygen ($O_2$), ozone ($O_3$), distilled water ($H_2O$), hydrogen peroxide ($H_2O_2$), nitrogen monoxide (NO), nitrous oxide ($N_2O$), and nitrogen dioxide ($NO_2$) being activated, but is not necessarily limited thereto.

Specifically, the method of producing a silicon metal oxide encapsulation layer according to an exemplary embodiment of the present invention may include: a) heating an object to be deposited (substrate) positioned in a chamber to a deposition temperature and maintaining at the temperature; b) introducing a metal precursor and a silicon precursor into a reactor at the same time; c) bringing the metal precursor and the silicon precursor introduced into the reactor into contact with the substrate so that the precursors are adsorbed on the object to be deposited (substrate); and d) injecting a reaction gas to the object to be deposited on which silicon is adsorbed and contains a metal or a metal oxide to form the silicon metal oxide encapsulation layer.

More specifically, the metal precursor and the silicon precursor may be supplied at the same time in step b). Here, after step b) or step c), a step of purging by supplying an inert gas into a chamber may be further performed, of course.

In the method of producing a silicon metal oxide encapsulation layer according to an exemplary embodiment, deposition conditions may be adjusted depending on the structure or thermal properties of the thin film to be desired. Specifically, an example of the deposition conditions may include an introduction flow rate of the metal precursor and the silicon precursor, the reaction gas, an introduction flow rate of carrier gas, pressure, a temperature of the object to be deposited, and the like. As a non-limiting example of the deposition conditions, the introduction flow rate of the metal precursor may be adjusted to 10 to 1000 cc/min, the flow rate of the carrier gas may be adjusted to 10 to 1000 cc/min, the flow rate of the reaction gas may be adjusted to 1 to 1500 cc/min, the pressure may be adjusted to 0.5 to 10 torr, the temperature of the object to be deposited may be adjusted to a range of 10 to 200° C., specifically to a range of 20° C. or more and less than 150° C., but the present invention is not limited thereto. Furthermore, according to an advantageous exemplary embodiment, when the reaction gas is in the state of being activated with plasma, that is, when deposition is performed using a plasma enhanced atomic layer deposition (PEALD), an RF power may be 50 to 1000 W, but is not necessarily limited thereto.

The object to be deposited used in the method of producing a silicon metal oxide encapsulation layer according to an exemplary embodiment of the present invention may be a semiconductor substrate including one or more semiconductor materials among Si, Ge, SiGe, GaP, GaAs, SiC, SiGeC, InAs, and InP; a silicon on insulator (SOI) substrate; a quartz substrate; a glass substrate for a display; a flexible plastic substrate such as polyimide, polyethylene terephthalate (PET), polyethylene naphthalate (PEN), polymethyl methacrylate (PMMA), polycarbonate (PC), polyethersulfone (PES), and polyester; and the like, but is not limited thereto. An example of the specific and preferred substrate may be a foldable substrate having a folding property, and more specifically, a polymer film having an appropriate thickness. The polymer may be polymers such as polyimide, polyethylene terephthalate (PET), polyethylene naphthalate (PEN), polymethyl methacrylate (PMMA), polycarbonate (PC), polyethersulfone (PES), polyester, or the like.

In addition, the silicon metal oxide may be in direct contact with the object to be deposited to be directly formed into a thin film, and a plurality of conductive layers, dielectric layers, insulation layers, or the like may be interposed between the object to be deposited and the silicon metal oxide thin film.

In addition, the present invention provides a multilayer thin film for an OLED, and the multilayer thin film for an OLED includes: a substrate, a first layer including a first silicon metal oxide represented by the following Chemical Formula 1, a second layer including a polymer, disposed on the first layer, and a third layer including a second silicon metal oxide represented by the following Chemical Formula 1, disposed on the second layer:

$$Si_xM_yO_z \quad \text{[Chemical Formula 1]}$$

wherein
M is a metal,
x satisfies $0.1<x<1$,
y satisfies $0<y<2$,
z satisfies $1 \leq z \leq 3$,
x+y satisfies $1<x+y<3$, and
x+y+z satisfies $1.5<x+y+z<6$.

The first silicon metal oxide and the second silicon metal oxide may be the same or different from each other. When the first silicon metal oxide and the second silicon metal oxide are different, it means that x, y, and z values are different from each other in Chemical Formula 1.

The polymer of the second layer may be a crosslinkable polymer, and the multilayer thin film is crosslinked under a known curing condition so that the crosslinkable polymer of the second layer may be a cured crosslinked polymer.

The polymer of the second layer according to an exemplary embodiment of the present invention is not limited, but may be a polyimide-based block copolymer, and the polyimide-based block copolymer may have a weight average molecular weight of 100,000 to 5,000,000 g/mol, preferably 200,000 to 1,000,000 g/mol, more preferably 300,000 to 750,000 g/mol, and still more preferably 500,000 to 650,000 g/mol. The polyimide-based block copolymer film according to an exemplary embodiment of the present invention may be produced by a common method such as a dry method or a wet method using the polyimide-based block copolymer. As an example, the polyimide-based block copolymer film may be obtained by a method in which a solution including the copolymer is coated on any support to form a film, and a solvent is evaporated from the film to dry the film, and if necessary, stretching and a thermal treatment may be performed.

Since the polymer of the second layer according to an exemplary embodiment of the present invention is a polyimide-based block copolymer film, the film may be colorless and transparent, and show excellent mechanical physical properties. The multilayer thin film for an OLED according to the preferred embodiment of the present invention may be a flexible multilayer thin film, and as an advantageous embodiment, may be a foldable multilayer thin film. When the multilayer thin film for an OLED has a foldable property, a radius of curvature of the multilayer thin film for an OLED may be 3R or less, preferably 2R or less, and preferably it may be more than R and 2R or less.

In addition, the present invention provides an OLED device including the silicon metal oxide encapsulation layer represented by Chemical Formula 1.

Hereinafter, the present invention will be described in more detail by the following Examples. Prior to that, terms and words used in the present specification and claims are not to be construed as having a general or dictionary meaning but are to be construed as having meaning and concepts meeting the technical ideas of the present invention, based on a principle that the inventors can appropriately define the concepts of terms in order to describe their own inventions in best mode.

Therefore, the configurations illustrated in the Examples and drawings described herein are merely the most preferred exemplary embodiment of the present invention but do not represent all of the technical spirit of the present invention. Thus, it should be understood that there are various equivalents and modified examples to replace these at the time of filing the present application.

In addition, the following Examples were all carried out by the known plasma enhanced atomic layer deposition (PEALD) using 200 mm single wafer type ALD equipment (CN1, Atomic Premium) in a shower head mode. In addition, the Examples may be carried out by the known plasma enhanced chemical vapor deposition (PECVD) using 200 mm single wafer type CVD equipment (CN1, Atomic Premium) in a commercialized shower head mode.

The thickness of the deposited silicon metal oxide encapsulation layer was measured using Ellipsometer (OPTI-PROBE 2600, THERMA-WAVE), an infrared spectroscopy (IFS66V/S & Hyperion 3000, Bruker Optics), an X-ray photoelectron spectroscopy, and a water vapor transmission rate (WVTR) measurement apparatus (MOCON, Aquatran 2) were used, an amount of nitrogen used in the measurement was 20 ml/min·Air, and a vapor transmission rate-measuring area was set at 50 cm². Dry etching was performed after the silicon metal oxide thin film was formed, and a dry etching rate was performed by a common plasma etching method using a plasma etching apparatus (Exelan HPT, Lam research), and at the time, an etching gas was a mixed gas including $C_4F_8$ (perfluorocyclobutane), a temperature was set at 20° C., a driving pressure was set at 70 mTorr, and a plasma power was set at 250 W in the upper end/250 W in the lower end. Stress measurement was performed using a stress meter (Frontier Semiconductor, FSM500TC), with a measuring area of 160 mm and a silicon wafer thickness set at 0.725 μm, thereby analyzing the thin film properties.

[Example 1] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and cyclopentadienyl tri(dimethylamino) zirconium was used as a metal precursor, and the silicon precursor was introduced at $1.84 \times 10^{-4}$ mol/sec and the zirconium precursor was introduced at $9.09 \times 10^{-7}$ mol/sec, thereby producing a silicon zirconium oxide encapsulation layer, and film formation was evaluated. Nitrous oxide ($N_2O$) was used as a reaction gas with plasma, and argon which is an inert gas was used for purging. The number of deposition was 136 cycles, and the specific deposition method of the silicon metal oxide encapsulation layer is shown in Table 1.

The thickness of the deposited encapsulation layer was measured by an ellipsometer, the formation of the silicon metal oxide encapsulation layer was analyzed using an infrared spectrophotometer, and the composition of the silicon metal oxide encapsulation layer was analyzed using an X-ray photoelectron spectroscope and is shown in Table 2. In addition, a plasma etching apparatus was used to measure a dry etching rate of the silicon metal oxide encapsulation layer, a stress meter was used to analyze a stress of the silicon metal oxide encapsulation layer, and for measuring a water vapor transmission rate of the encapsulation layer, moisture penetration evaluation equipment was used to measure a vapor transmission rate. Hereinafter, specific analysis results of the silicon metal oxide encapsulation layer are shown in Table 3, the transmittance of the deposited film using an infrared spectroscope is illustrated in FIG. 1, and analysis results of measuring the water vapor transmission rate using a vapor transmission rate measurement apparatus are illustrated in FIG. 4.

[Example 2] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and cyclopentadienyl tri(dimethylamino) zirconium was used as a metal precursor, and the silicon precursor was introduced at $1.84 \times 10^{-4}$ mol/sec and the zirconium precursor was introduced at $1.82 \times 10^{-6}$ mol/sec, thereby producing a silicon zirconium oxide encapsulation layer, and film formation was evaluated. Nitrous oxide ($N_2O$) was used as a reaction gas with plasma, and argon which is an inert gas was used for purging. The number of deposition was 116 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an infrared spectroscope is illustrated in FIG. 1, and analysis results of measuring the water vapor transmission rate using a vapor transmission rate measurement apparatus are illustrated in FIG. 4.

[Example 3] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and cyclopentadienyl tri(dimethylamino) zirconium was used as a metal precursor, and the silicon precursor was introduced at $1.84 \times 10^{-4}$ mol/sec and the zirconium precursor was introduced at $3.64 \times 10^{-6}$ mol/sec, thereby producing a silicon zirconium oxide encapsulation layer, and film formation was evaluated. Nitrous oxide ($N_2O$) was used as a reaction gas with plasma, and argon which is an inert gas was used for purging. The number of deposition was 112 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an infrared spectroscope is illustrated in FIG. 1, and analysis results of measuring the water vapor transmission rate using a vapor transmission rate measurement apparatus are illustrated in FIG. 4.

[Example 4] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and trimethylaluminum was used as a metal precursor, and the silicon precursor was introduced at $1.84 \times 10^{-4}$ mol/sec and the aluminum precursor was introduced at $3.83 \times 10^{-5}$ mol/sec, thereby producing a silicon aluminum oxide encapsulation layer, and film formation was evaluated. Nitrous oxide ($N_2O$) was used as a reaction gas with plasma, and argon which is an inert gas was used for purging. The number of deposition was 125 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an infrared spectroscope is illustrated in FIG. 2, and analysis results of measuring the water vapor transmission rate using a vapor transmission rate measurement apparatus are illustrated in FIG. 5.

[Example 5] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and trimethylaluminum was used as a metal precursor, and the silicon precursor was introduced at $1.84 \times 10^{-4}$ mol/sec and the aluminum precursor was introduced at $5.1 \times 10^{-5}$ mol/sec, thereby producing a silicon aluminum oxide encapsulation layer, and film formation was evaluated. Nitrous oxide ($N_2O$) was used as a reaction gas with plasma, and argon which is an inert gas was used for purging. The number of deposition was 125 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an infrared spectroscope is illustrated in FIG. 2, and analysis results of measuring the water vapor transmission rate using a vapor transmission rate measurement apparatus are illustrated in FIG. 5.

[Example 6] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and trimethylaluminum was used as a metal precursor, and the silicon precursor was introduced at $1.84 \times 10^{-4}$ mol/sec and the aluminum precursor was introduced at $6.38 \times 10^{-5}$ mol/sec, thereby producing a silicon aluminum oxide encapsulation layer, and film formation was evaluated. Nitrous oxide ($N_2O$) was used as a reaction gas with plasma, and argon which is an inert gas was used for purging. The number of deposition was 105 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an infrared spectroscope is illustrated in FIG. 2, and analysis results of measuring the water vapor transmission rate using a vapor transmission rate measurement apparatus are illustrated in FIG. 5.

[Example 7] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and dimethyl bis(dimethylamino)tin was used as a metal precursor, and the silicon precursor was introduced at $1.84 \times 10^{-4}$ mol/sec and the tin precursor was introduced at $5.23 \times 10^{-7}$ mol/sec, thereby producing a silicon tin oxide encapsulation layer, and film formation was evaluated. Nitrous oxide ($N_2O$) was used as a reaction gas with plasma, and argon which is an inert gas was used for purging. The number of deposition was 140 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an infrared spectroscope is illustrated in FIG. 2, and analysis results of measuring the water vapor transmission rate using a vapor transmission rate measurement apparatus are illustrated in FIG. 5.

[Example 8] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and dimethyl bis(dimethylamino)tin was used as a metal precursor, and the silicon precursor was introduced at $1.84 \times 10^{-4}$ mol/sec and the tin precursor was introduced at $3.38 \times 10^{-6}$ mol/sec, thereby producing a silicon tin oxide encapsulation layer, and film formation was evaluated. Nitrous oxide ($N_2O$) was used as a reaction gas with plasma, and argon which is an inert gas was used for purging. The number of deposition was 133 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an ultraviolet spectroscope is illustrated in FIG. 2, and analysis results of measuring the water vapor transmission rate using a vapor transmission rate measurement apparatus are illustrated in FIG. 5.

[Example 9] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and dimethyl bis(dimethylamino)tin was used as a metal precursor, and the silicon precursor was introduced at $1.84 \times 10^{-4}$ mol/sec and the tin precursor was introduced at $6.75 \times 10^{-6}$ mol/sec, thereby producing a silicon tin oxide encapsulation layer, and film formation was evaluated. Nitrous oxide ($N_2O$) was used as a reaction gas with plasma, and argon which is an inert gas was used for purging. The number of deposition was 133 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an ultraviolet spectroscope is illustrated in FIG. 2, and analysis results of measuring the water vapor transmission rate using a vapor transmission rate measurement apparatus are illustrated in FIG. 5.

[Example 10] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and dimethyl bis(dimethylamino)tin was used as a metal precursor, and the silicon precursor was introduced at $1.84 \times 10^{-4}$ mol/sec and the tin precursor was introduced at $9.15 \times 10^{-6}$ mol/sec, thereby producing a silicon tin oxide encapsulation layer, and film formation was evaluated. Nitrous oxide ($N_2O$) was used as a reaction gas with plasma, and argon which is an inert gas was used for purging. The number of deposition was 130 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an ultraviolet spectroscope is illustrated in FIG. 3, and analysis results of measuring the water vapor transmission rate using a vapor transmission rate measurement apparatus are illustrated in FIG. 6.

[Example 11] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and dimethyl bis(dimethylamino)tin was used as a metal precursor, and the silicon precursor was introduced at $5.52\times10^{-5}$ mol/sec and the tin precursor was introduced at $9.15\times10^{-6}$ mol/sec, thereby producing a silicon tin oxide encapsulation layer, and film formation was evaluated. Nitrous oxide ($N_2O$) was used as a reaction gas with plasma, and argon which is an inert gas was used for purging. The number of deposition was 125 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an ultraviolet spectroscope is illustrated in FIG. 3, and analysis results of measuring the water vapor transmission rate using a vapor transmission rate measurement apparatus are illustrated in FIG. 6.

[Example 12] Production of Silicon Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon metal oxide encapsulation layer, diisopropylaminosilane was used as a silicon precursor and dimethyl bis(dimethylamino)tin was used as a metal precursor, and the silicon precursor was introduced at $1.97\times10^{-5}$ mol/sec and the tin precursor was introduced at $1.31\times10^{-5}$ mol/sec, and film formation was evaluated. Nitrous oxide ($N_2O$) was used as a reaction gas with plasma, and argon which is an inert gas was used for purging. The number of deposition was 125 cycles, and the specific deposition method of the silicon metal oxide encapsulation layer is shown in Table 1.

The deposited encapsulation layer was subjected to the same analysis method as Example 1 and specific analysis results of the silicon metal oxide encapsulation layer are shown in the following Tables 2 and 3, the transmittance of the deposited film using an ultraviolet spectroscope is illustrated in FIG. 3, and analysis results of measuring the water vapor transmission rate using a vapor transmission rate measurement apparatus are illustrated in FIG. 6.

[Comparative Example 1] Production of Silicon Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon oxide encapsulation layer, bis(dimethylaminomethylsilyl)amine was used as a silicon precursor, and the silicon precursor was introduced at $1.84\times10^{-4}$ mol/sec, thereby producing a silicon oxide encapsulation layer, and film formation was evaluated. Nitrous oxide ($N_2O$) was used as a reaction gas with plasma, and argon which is an inert gas was used for purging. The number of deposition was 370 cycles, and the specific deposition method of the silicon oxide encapsulation layer is shown in Table 1.

The deposited encapsulation layer was subjected to the same analysis method as Example 1 and specific analysis results of the silicon oxide encapsulation layer are shown in the following Tables 2 and 3, the transmittance of the deposited film using an infrared spectroscope is illustrated in FIG. 1, and analysis results of measuring the water vapor transmission rate using a vapor transmission rate measurement apparatus are illustrated in FIG. 4.

[Comparative Example 2] Production of Silicon Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a silicon oxide encapsulation layer, diisopropylaminosilane was used as a silicon precursor, and the silicon precursor was introduced at $5.66\times10^{-4}$ mol/sec, thereby producing a silicon oxide encapsulation layer, and film formation was evaluated. Nitrous oxide ($N_2O$) was used as a reaction gas with plasma, and argon which is an inert gas was used for purging. The number of deposition was 608 cycles, and the specific deposition method of the silicon oxide encapsulation layer is shown in Table 1.

The deposited encapsulation layer was subjected to the same analysis method as Example 1 and specific analysis results of the silicon oxide encapsulation layer are shown in the following Tables 2 and 3, the transmittance of the deposited film using an infrared spectroscope is illustrated in FIG. 1, and analysis results of measuring the water vapor transmission rate using a vapor transmission rate measurement apparatus are illustrated in FIG. 4.

[Comparative Example 3] Production of Metal Oxide Encapsulation Layer by Plasma Enhanced Atomic Layer Deposition (PEALD)

In a common plasma enhanced atomic layer deposition (PEALD) apparatus using a known plasma enhanced atomic layer deposition (PEALD), for forming a metal oxide encapsulation layer, dimethyl bis(dimethylamino)tin was used as a metal precursor, and the tin precursor was introduced at $3.38\times10^{-6}$ mol/sec, thereby producing a tin oxide encapsulation layer, and film formation was evaluated. Nitrous oxide ($N_2O$) was used as a reaction gas with plasma, and argon which is an inert gas was used for purging. The number of deposition was 241 cycles, and the specific deposition method of the metal oxide encapsulation layer is shown in Table 1.

The deposited encapsulation layer was subjected to the same analysis method as Example 1 and specific analysis results of the metal oxide encapsulation layer are shown in the following Tables 2 and 3, the transmittance of the deposited film using an infrared spectroscope is illustrated in FIG. 1, and analysis results of measuring the water vapor transmission rate using a vapor transmission rate measurement apparatus are illustrated in FIG. 4.

TABLE 1

Deposition conditions of silicon metal oxide encapsulation layer

| Classification | Encapsulation layer material | Deposition temperature °C. | Source injection Metal precursor mol/sec | Source injection Silicon precursor mol/sec | Source purge Flow rate sccm | Source purge Time sec | Reaction gas and plasma Flow rate sccm | Reaction gas and plasma Plasma density W/cm$^2$ | Reaction gas and plasma Time sec | Reaction gas purge Flow rate sccm | Reaction gas purge Time sec | Number of deposition Cycle |
|---|---|---|---|---|---|---|---|---|---|---|---|---|
| Example 1 | Silicon zirconium oxide | 90 | $9.09 \times 10^{-7}$ | $1.84 \times 10^{-4}$ | 600 | 0.4 | 400 | 0.65 | 0.9 | 300 | 0.1 | 136 |
| Example 2 | Silicon zirconium oxide | 90 | $1.82 \times 10^{-6}$ | $1.84 \times 10^{-4}$ | 600 | 0.4 | 400 | 0.65 | 0.9 | 300 | 0.1 | 116 |
| Example 3 | Silicon zirconium oxide | 90 | $3.64 \times 10^{-6}$ | $1.84 \times 10^{-4}$ | 600 | 0.4 | 400 | 0.65 | 0.9 | 300 | 0.1 | 112 |
| Example 4 | Silicon aluminum oxide | 90 | $3.83 \times 10^{-5}$ | $1.84 \times 10^{-4}$ | 600 | 0.4 | 400 | 0.65 | 0.9 | 300 | 0.1 | 125 |
| Example 5 | Silicon aluminum oxide | 90 | $5.10 \times 10^{-5}$ | $1.84 \times 10^{-4}$ | 600 | 0.4 | 400 | 0.65 | 0.9 | 300 | 0.1 | 125 |
| Example 6 | Silicon aluminum oxide | 90 | $6.38 \times 10^{-5}$ | $1.84 \times 10^{-4}$ | 600 | 0.4 | 400 | 0.65 | 0.9 | 300 | 0.1 | 105 |
| Example 7 | Silicon tin oxide | 90 | $5.23 \times 10^{-7}$ | $1.84 \times 10^{-4}$ | 600 | 0.4 | 400 | 0.65 | 0.9 | 300 | 0.1 | 140 |
| Example 8 | Silicon tin oxide | 90 | $3.38 \times 10^{-6}$ | $1.84 \times 10^{-4}$ | 600 | 0.4 | 400 | 0.65 | 0.9 | 300 | 0.1 | 133 |
| Example 9 | Silicon tin oxide | 90 | $6.75 \times 10^{-6}$ | $1.84 \times 10^{-4}$ | 600 | 0.4 | 400 | 0.65 | 0.9 | 300 | 0.1 | 133 |
| Example 10 | Silicon tin oxide | 90 | $9.15 \times 10^{-6}$ | $1.84 \times 10^{-4}$ | 600 | 0.4 | 400 | 0.65 | 0.9 | 300 | 0.1 | 130 |
| Example 11 | Silicon tin oxide | 90 | $9.15 \times 10^{-6}$ | $5.52 \times 10^{-5}$ | 600 | 0.4 | 400 | 0.65 | 0.9 | 300 | 0.1 | 125 |
| Example 12 | Silicon tin oxide | 90 | $1.31 \times 10^{-6}$ | $1.97 \times 10^{-5}$ | 600 | 0.4 | 400 | 0.65 | 0.9 | 300 | 0.1 | 125 |
| Comparative Example 1 | Silicon oxide | 90 | — | $1.84 \times 10^{-4}$ | 600 | 0.4 | 400 | 0.65 | 0.9 | 300 | 0.1 | 370 |
| Comparative Example 2 | Silicon oxide | 90 | — | $5.66 \times 10^{-4}$ | 600 | 0.4 | 400 | 0.65 | 0.9 | 300 | 0.1 | 608 |
| Comparative Example 3 | Metal oxide | 90 | $3.38 \times 10^{-6}$ | — | 600 | 0.4 | 400 | 0.65 | 0.9 | 300 | 0.1 | 241 |

TABLE 2

Results of using X-ray photoelectron spectroscope in silicon metal oxide encapsulation layer

| | Si % | Metal % | O % |
|---|---|---|---|
| Example 1 | 31.2 | 2.8 | 66 |
| Example 2 | 29.1 | 4.9 | 66 |
| Example 3 | 26.9 | 7.1 | 66 |
| Example 4 | 26.5 | 7.4 | 66.1 |
| Example 5 | 23.9 | 9.9 | 66.2 |
| Example 6 | 23.8 | 10.1 | 66.1 |
| Example 7 | 33.7 | 4.6 | 61.7 |
| Example 8 | 26.7 | 8.5 | 64.8 |
| Example 9 | 25.5 | 12.9 | 61.6 |
| Example 10 | 24.8 | 16.1 | 59.1 |
| Example 11 | 14.3 | 27.1 | 58.6 |
| Example 12 | 6.7 | 35.0 | 58.3 |
| Comparative Example 1 | 33.8 | 0 | 66.2 |
| Comparative Example 2 | 33.9 | 0 | 66.1 |
| Comparative Example 3 | 0.0 | 33.3 | 66.7 |

TABLE 3

Evaluation of properties of silicon metal oxide encapsulation layer

| | Encapsulation layer material | Variable Unit | Deposition speed Å/cycle | Thin film thickness Å | Metal content % | Refractive index | Transmittance % | Stress MPa | Dry etching rate Å/sec | Vapor transmission rate g/[m$^2$ – day] |
|---|---|---|---|---|---|---|---|---|---|---|
| Example 1 | Silicon zirconium oxide | Zirconium precursor introduction amount | 2.47 | 336 | 2.8 | 1.49 | 100 | −135 | 20 | $7.5 \times 10^{-2}$ |
| Example 2 | Silicon zirconium oxide | Zirconium precursor introduction amount | 2.68 | 311 | 4.9 | 1.51 | 100 | 17.58 | 19.6 | $6.59 \times 10^{-3}$ |
| Example 3 | Silicon zirconium oxide | Zirconium precursor introduction amount | 2.82 | 316 | 7.1 | 1.53 | 100 | 178.1 | 8.1 | $2.66 \times 10^{-3}$ |
| Example 4 | Silicon aluminum oxide | Aluminum precursor introduction amount | 2.54 | 318 | 7.4 | 1.49 | 100 | −662 | 18.5 | $3.60 \times 10^{-2}$ |
| Example 5 | Silicon aluminum oxide | Aluminum precursor introduction amount | 2.55 | 319 | 9.9 | 1.49 | 100 | −201 | 15.9 | $3.24 \times 10^{-2}$ |
| Example 6 | Silicon aluminum oxide | Aluminum precursor introduction amount | 2.85 | 299 | 10.1 | 1.49 | 100 | −79.76 | 15.3 | $5.5 \times 10^{-3}$ |
| Example 7 | Silicon tin oxide | Tin precursor introduction amount | 2.09 | 292 | 4.6 | 1.52 | 100 | −135 | 16.9 | $3.15 \times 10^{-3}$ |
| Example 8 | Silicon tin oxide | | 2.26 | 301 | 8.5 | 1.59 | 100 | −15 | 12.4 | $2.09 \times 10^{-3} - 3$ |
| Example 9 | Silicon tin oxide | | 2.24 | 298 | 12.9 | 1.63 | 100 | 35 | 8.7 | $7.50 \times 10^{-4}$ |
| Example 10 | Silicon tin oxide | | 2.32 | 302 | 16.1 | 1.66 | 100 | 57 | 5.6 | $3.15 \times 10^{-4}$ |
| Example 11 | Silicon tin oxide | | 2.42 | 303 | 27.1 | 1.76 | 100 | 155 | 3.2 | $6.98 \times 10^{-5}$ |
| Example 12 | Silicon tin oxide | | 2.44 | 305 | 35.0 | 1.86 | 100 | 192 | 3.1 | $1.54 \times 10^{-5}$ |
| Comparative Example 1 | Silicon oxide | Silicon precursor | 1.95 | 733 | 0 | 1.48 | 100 | −144 | 20.6 | $4.50 \times 10^{-3}$ |
| Comparative Example 2 | Silicon oxide | Silicon precursor | 1.15 | 700 | 0 | 1.48 | 100 | −334 | 20.6 | $5.2 \times 10^{-3}$ |
| Comparative Example 3 | Tin oxide | Metal precursor | 1.22 | 294 | 33.3 | 2.20 | 95.5 | 165 | 1.8 | $9.06 \times 10^{-3}$ |

As seen from Tables 1 and 2, it was found that the deposition rates of Examples 1 to 12 were 83.6 to 114 Å per minute based on a total deposition time and 2.09 to 2.85 Å/cycle based on a deposition cycle, and the deposition rates of Comparative Examples 1 to 3 were 46 to 78 Å per minute based on a total deposition time and in a range of 1.15 to 1.95 Å/cycle based on a deposition cycle. Thus, it was confirmed that the thin films of Examples 1 to 12 were deposited at excellent deposition rates at least 1.1 times to at most 2.5 times or more the deposition rates of Comparative Examples 1 to 3, and the deposition rate of Comparative Example 1 was lower than the highest deposition rate of Example 6 by 36 Å per minute based on a deposition time and 0.90 Å/cycle or more based on a deposition cycle.

In addition, the refractive indexes of Examples 1 to 3 were 1.49, 1.51, and 1.53, respectively, the refractive indexes of Examples 4 to 6 were all 1.49, the refractive indexes of Examples 7 to 12 were 1.52 and 1.88, and the refractive indexes of Comparative Examples 1 to 3 were 1.48, 1.48, and 2.20, respectively. In the refractive index to the metal content in Examples 7 to 12, it was found that when the same metals are included as illustrated in FIG. 5, a higher refractive index is formed at a higher metal content, and it was confirmed that the refractive index may be adjusted depending on metal content change as well as a metal type.

In addition, it was confirmed that when the thin film thickness of Examples 1 to 12 was 292 to 336 Å, the film had a stress of −662 to 192 MPa, and when the thin film thickness was 298 Å, the film had a significantly low vapor transmission ability of $7.05 \times 10^{-4}$ g/[m$^2$-day].

Besides, Examples 1 to 12 had significantly better sealing properties than those of Comparative Examples 1 to 3 as shown FIGS. 1 to 4; it was confirmed from FIGS. 1 and 2 that the silicon metal oxide encapsulation layers of Examples 1 to 12 had higher visible light transmittance than those of Comparative Examples 1 to 3, and it was confirmed that Example 8 having a thin film thickness of 300 Å which is significantly thinner than the thin film thickness of 700 Å of Comparative Examples 1 and 2 had lower vapor transmission ability by 14 times or more, as illustrated in FIGS. 3 and 4.

It was confirmed therefrom that the silicon metal oxide encapsulation layers of Examples 1 to 8 had significantly better thin film growth rate and low vapor transmission rate than the silicon or metal oxide encapsulation layers of Comparative Examples 1 to 3, and also allowed the refractive index and the etching rate to be adjusted so that it is easy to secure high flexibility by stress adjustment, and thus, may have very excellent properties as an encapsulation layer for a flexible display to which a flexible substrate is applied.

That is, it was found that when the silicon metal oxide encapsulation layer represented by Chemical Formula 1 is included according to the present invention, a high-quality silicon metal oxide encapsulation layer having a low vapor transmission rate at a small thickness may be formed at a surprisingly rapid speed, a dry etching rate is excellent so that it is easy to remove particles produced during silicon oxide deposition and a difficulty in cleaning caused by conventional metal oxide deposition may be overcome, and thus, process productivity may be significantly improved.

In addition, since the stress intensity and the refractive index of the silicon metal oxide encapsulation layer of the present invention may be adjusted by the metal content, it was confirmed that a conventional thin film encapsulation process in which an organic material and an inorganic material are repeatedly stacked so that the film is formed to be very thick may be significantly shortened, and the encapsulation layer may be very thin and secure optical properties and flexibility, and thus, the present invention has very high applicability as an encapsulation technology appropriate for a flexible display.

[Experiment 1] Measurement of Folding Endurance

Folding endurance of the encapsulation layers of Examples 1 to 12 and Comparative Examples 1 to 3 was evaluated using an MIT type folding endurance tester in accordance with the ASTM standard D2176-16.

A film specimen (1 cm×7 cm) was loaded to a folding endurance tester, and the number of reciprocating cycles was measured until the film specimen was bent from the left and the right of the specimen, with a loading of 250 g at an angle of 135° and a radius of curvature of 0.8 mm, at a speed of 175 rpm, and then broken and is shown in the following Table 4:

TABLE 4

| | Number of bending cycles (Unit: 10,000) |
|---|---|
| Example 1 | 16.9 |
| Example 2 | 17.5 |
| Example 3 | 17.9 |
| Example 4 | 17.5 |
| Example 5 | 18.0 |
| Example 6 | 18.1 |
| Example 7 | 17.5 |
| Example 8 | 18.3 |
| Example 9 | 19.1 |
| Example 10 | 19.5 |
| Example 11 | 21.1 |
| Example 12 | 22.3 |

TABLE 4-continued

| | Number of bending cycles (Unit: 10,000) |
|---|---|
| Comparative Example 1 | 8.2 |
| Comparative Example 2 | 8.9 |
| Comparative Example 3 | 10.2 |

As seen from Table 4, it was found that the silicon metal oxide encapsulation layers of the present invention had significantly improved folding endurance as compared with the encapsulation layers of Comparative Examples 1 to 3.

Hereinabove, although the present invention has been described by specific matters, limited exemplary embodiments, and drawings, they have been provided only for assisting in the more entire understanding of the present invention, and the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope of the spirit of the invention.

What is claimed is:

1. A silicon metal oxide encapsulation layer formed on a substrate, wherein the silicon metal oxide encapsulation layer comprises a silicon metal oxide represented by the following Chemical Formula 1:

$$Si_xM_yO_z \quad \text{[Chemical Formula 1]}$$

wherein
M is a metal selected from the group consisting of Zr, Ga, In, Sn, Pb, V, Cu, Ag, Nb and Cd,
x satisfies 0.1<x<1,
y satisfies 0<y<2,
z satisfies 1≤z≤3,
x+y satisfies 1<x+y<3, and
x+y+z satisfies 1.5<x+y+z<6.

2. The silicon metal oxide encapsulation layer of claim 1, wherein the encapsulation layer is an encapsulation layer for a display OLED.

3. The silicon metal oxide encapsulation layer of claim 1, wherein the silicon metal oxide encapsulation layer includes a metal atom at a content within 1 to 50 at % relative to a total content of a silicon metal oxide.

4. The silicon metal oxide encapsulation layer of claim 1, wherein the silicon metal oxide encapsulation layer has a vapor transmission rate of $1.0 \times 10^{-2}$ to $1.0 \times 10^{-6}$ g/m$^2$-day.

5. The silicon metal oxide encapsulation layer of claim 1, wherein the silicon metal oxide encapsulation layer has a stress of −700 to +700 MPa and a refractive index of 1.0 to 10.

6. The silicon metal oxide encapsulation layer of claim 1, wherein the silicon metal oxide encapsulation layer is dry-etched by one or more etching gases selected from fluorine-containing compounds, NF$_3$, and BCl$_3$.

7. The silicon metal oxide encapsulation layer of claim 1, wherein the silicon metal oxide encapsulation layer has a thickness of 50 to 700 Å.

8. A method of producing the silicon metal oxide encapsulation layer formed on a substrate according to claim 1, using an atomic layer deposition (ALD), comprising:

introducing a metal precursor which is an organometal compound including at least one metal element selected from the group consisting of Zr, Ga, In, Sn, Pb, V, Cu, Ag, Nb and Cd as a central metal and a silicon precursor into a reactor at the same time so that the precursors are in contact with the substrate; and bringing a reaction gas into contact with the substrate.

9. The method of claim 8, wherein the silicon precursor is an organoaminosilane compound including a Si-N bond.

10. The method of claim 8, wherein the atomic layer deposition (ALD) is a plasma enhanced atomic layer deposition (PEALD).

11. The method of claim 8, wherein the reaction gas is one or two or more selected from $O_2$, $N_2O$, $NO_2$, $H_2O$, $H_2O_2$, and $O_3$.

12. A multilayer thin film for an OLED comprising: a substrate, a first layer including a first silicon metal oxide represented by the following Chemical Formula 1, a second layer including a crosslinkable polymer, disposed on the first layer, and a third layer including a second silicon metal oxide represented by the following Chemical Formula 1, disposed on the second layer, wherein the first silicon metal oxide and the second silicon metal oxide are the same as or different from each other:

$$Si_xM_yO_z \quad \text{[Chemical Formula 1]}$$

wherein

M is a metal which is at least one selected from the group consisted of Zr, Ga, In, Sn, Pb, V, Cu, Ag, Nb and Cd, x satisfies $0.1<x<1$, y satisfies $0<y<2$, z satisfies $1 \leq z \leq 3$, x+y satisfies $1<x+y<3$, and x+y+z satisfies $1.5<x+y+z<6$.

13. The multilayer thin film for an OLED of claim 12, wherein the substrate is a flexible transparent substrate.

14. The multilayer thin film for an OLED of claim 12, wherein the multilayer thin film has a radius of curvature of 2R or less.

15. An OLED device comprising the silicon metal oxide encapsulation layer formed on the substrate according to claim 1.

* * * * *